(12) United States Patent
Wang et al.

(10) Patent No.: US 9,348,019 B2
(45) Date of Patent: May 24, 2016

(54) HYBRID IMAGE-SENSING APPARATUS HAVING FILTERS PERMITTING INCIDENT LIGHT IN INFRARED REGION TO BE PASSED TO TIME-OF-FLIGHT PIXEL

(71) Applicants: Wei-Ko Wang, Longtan Township, Taoyuan County (TW); Chin-Ching Chang, Hsinchu (TW); Chia-Hui Wu, Lunbei Township, Yunlin County (TW); Chien-Hsiung Huang, Hsinchu (TW); Cheng-Xuan Lin, Hukou Township, Hsinchu County (TW); Chang-Wei Chen, Kaohsiung (TW)

(72) Inventors: Wei-Ko Wang, Longtan Township, Taoyuan County (TW); Chin-Ching Chang, Hsinchu (TW); Chia-Hui Wu, Lunbei Township, Yunlin County (TW); Chien-Hsiung Huang, Hsinchu (TW); Cheng-Xuan Lin, Hukou Township, Hsinchu County (TW); Chang-Wei Chen, Kaohsiung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 378 days.

(21) Appl. No.: 13/682,389

(22) Filed: Nov. 20, 2012

(65) Prior Publication Data
US 2014/0138519 A1    May 22, 2014

(51) Int. Cl.
*H01L 27/14*  (2006.01)
*G01S 7/481*  (2006.01)
(Continued)

(52) U.S. Cl.
CPC ............. *G01S 7/4816* (2013.01); *G01S 17/023* (2013.01); *G01S 17/89* (2013.01); *H01L 27/1464* (2013.01); *H01L 27/14621* (2013.01); *H01L27/14629* (2013.01); *H01L 27/14645* (2013.01); *H01L 27/14649* (2013.01)

(58) Field of Classification Search
CPC . H01L 31/0203; H01L 31/0232; H01L 31/09; H01L 27/12; G01J 1/04; G01J 1/0271; G01J 1/0488; G01J 1/0492; G01J 5/20; G01J 5/202; G01J 5/10; G01J 3/0291; H04N 9/09; H04N 9/045; H04N 5/335; G08B 17/12; G02B 5/20; G02B 5/201; G02B 5/208
USPC ................ 250/228, 208.1, 239, 338.1, 338.4, 250/339.01, 339.02, 339.05, 216; 257/290–292, 440; 348/292–311
See application file for complete search history.

(56) References Cited

U.S. PATENT DOCUMENTS 7,560,679 B1    7/2009  Gutierrez
8,139,141 B2 *  3/2012  Bamji et al. .................. 348/348
(Continued)

FOREIGN PATENT DOCUMENTS

JP    2007-526453 A    9/2007
JP    201-510064 A     4/2012
(Continued)

OTHER PUBLICATIONS

Japanese Office Action dated Sep. 8, 2014, as issued in corresponding Japan Application No. 2013-157389 (with English translation—6 pages).

*Primary Examiner* — Tony Ko
(74) *Attorney, Agent, or Firm* — Muncy, Geissler, Olds & Lowe, P.C.

(57) ABSTRACT

An image-sensing apparatus is provided. The image-sensing apparatus includes: an optical filter array including a two-band passing filter and an infrared filter; an RGB pixel array placed below the two-band passing filter; and a TOF pixel array adjacent to the RGB pixel array and placed below the two-band passing filter and the infrared filter, wherein a combination of the two-band passing filter and the infrared passing filter permits only the incident light in the infrared region to pass to the ToF pixel array.

19 Claims, 10 Drawing Sheets

(51) Int. Cl.
*G01S 17/89* (2006.01)
*H01L 27/146* (2006.01)
*G01S 17/02* (2006.01)

(56) References Cited

U.S. PATENT DOCUMENTS

| | | | |
|---|---|---|---|
| 2008/0266431 A1* | 10/2008 | Ohyama et al. | 348/294 |
| 2009/0114802 A1* | 5/2009 | Kang | G01B 11/25 250/226 |
| 2011/0102547 A1* | 5/2011 | Sul et al. | 348/46 |
| 2011/0205412 A1* | 8/2011 | Miyazaki et al. | 348/294 |
| 2012/0056073 A1* | 3/2012 | Ahn | 250/208.1 |
| 2012/0056988 A1 | 3/2012 | Stanhill et al. | |

FOREIGN PATENT DOCUMENTS

| | | |
|---|---|---|
| WO | WO2005/072358 A2 | 8/2005 |
| WO | WO2010/068499 A1 | 6/2010 |

* cited by examiner

HYBRID IMAGE-SENSING APPARATUS HAVING FILTERS PERMITTING INCIDENT LIGHT IN INFRARED REGION TO BE PASSED TO TIME-OF-FLIGHT PIXEL

TECHNICAL FIELD

The present disclosure relates generally to an optoelectronic device, and more particularly to an image-sensing apparatus.

BACKGROUND

A color image sensor is a necessary component in many optoelectronic devices. The color image sensor is a photoelectric conversion device that may transform detected light into electrical signals. A conventional image sensor may include a plurality of unit pixels arranged in an array on a semiconductor substrate. Each of the unit pixels may include a photodiode and/or a plurality of transistors. The photodiode may detect external light and/or may generate and store charges, and the transistor may output electrical signals according to the stored charges. A complementary metal oxide semiconductor (CMOS) image sensor is the most commonly used image sensor. The CMOS image sensor may include a photodiode that can receive and/or store optical signals and can realize images with signal processing. The photodiode may be manufactured in a single chip together with the signal processing device using COMS manufacturing techniques.

A time-of-flight (hereinafter referred to as ToF) camera is a range-imaging camera system that resolves distance based on the known speed of light, measuring the time-of-flight of a light signal between the camera and the subject for each point of the image. By integrating the image sensor and the ToF camera, the color image may sense depth information, and therefore a three-dimensional image-sensing apparatus may be realized.

In general, the ToF camera may also include a photodiode for detecting external light, and the photodiode of the ToF camera may have an absorption wavelength region different from that of the photodiode of the color image sensor. Therefore, a suitable optical filter is needed to filter undesired wavelength regions of the ToF camera and the color image sensor when they are integrated together. For example, in an ideal condition, only visible light can pass to the RGB pixel and only the infrared light can pass to the ToF pixel, so as to have minimum interference and noise. However, there is currently no suitable optical filter that can meet the above requirements. The optical filter is usually formed with depositing techniques in mass production. The unit pixels of an color image sensor and ToF camera are small, in large quantities, and in an alternate arrangement. Thus, there is no suitable and effective material or method for forming a two-band pass filter array which can be fabricated in mass production that permits only the light in the visible light range to pass to each unit pixel of the color image sensor and only the light in the infrared range to pass to each unit pixel of the ToF camera.

Accordingly, a suitable optical filter array and an image-sensing apparatus using same are needed.

SUMMARY

Accordingly, an image-sensing apparatus is provided. The image-sensing apparatus includes: an optical filter array including a two-band passing filter and an infrared filter; an RGB pixel array placed below the two-band passing filter; and a TOF pixel array adjacent to the RGB pixel array and placed below the two-band passing filter and the infrared filter, wherein a combination of the two-band passing filter and the infrared passing filter permits only the incident light in the infrared region to pass to the ToF pixel array.

Accordingly, an image-sensing apparatus is provided. The image-sensing apparatus includes a substrate; an RGB pixel array and a ToF pixel array on the substrate; a two-band passing filter placed in front of both the RGB pixel array and the ToF pixel array for passing visible light and infrared light; and an infrared passing filter placed in front of the ToF pixel array for passing infrared light, wherein a combination of the two-band passing filter and the infrared passing filter permits only the incident light in the infrared region to pass to the ToF pixel array.

Furthermore, the present disclosure also provides another image-sensing apparatus, including an RGB pixel array on a first substrate; a ToF pixel array on a second substrate adjacent to the first substrate; a two-band passing filter placed in front of both the RGB pixel array and the ToF pixel array for passing visible light and infrared light; and an infrared passing filter placed in front of the ToF pixel array for passing infrared light, wherein a combination of the two-band passing filter and the infrared passing filter permits only the incident light in the infrared region to pass to the ToF pixel array.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

Figure 1A:
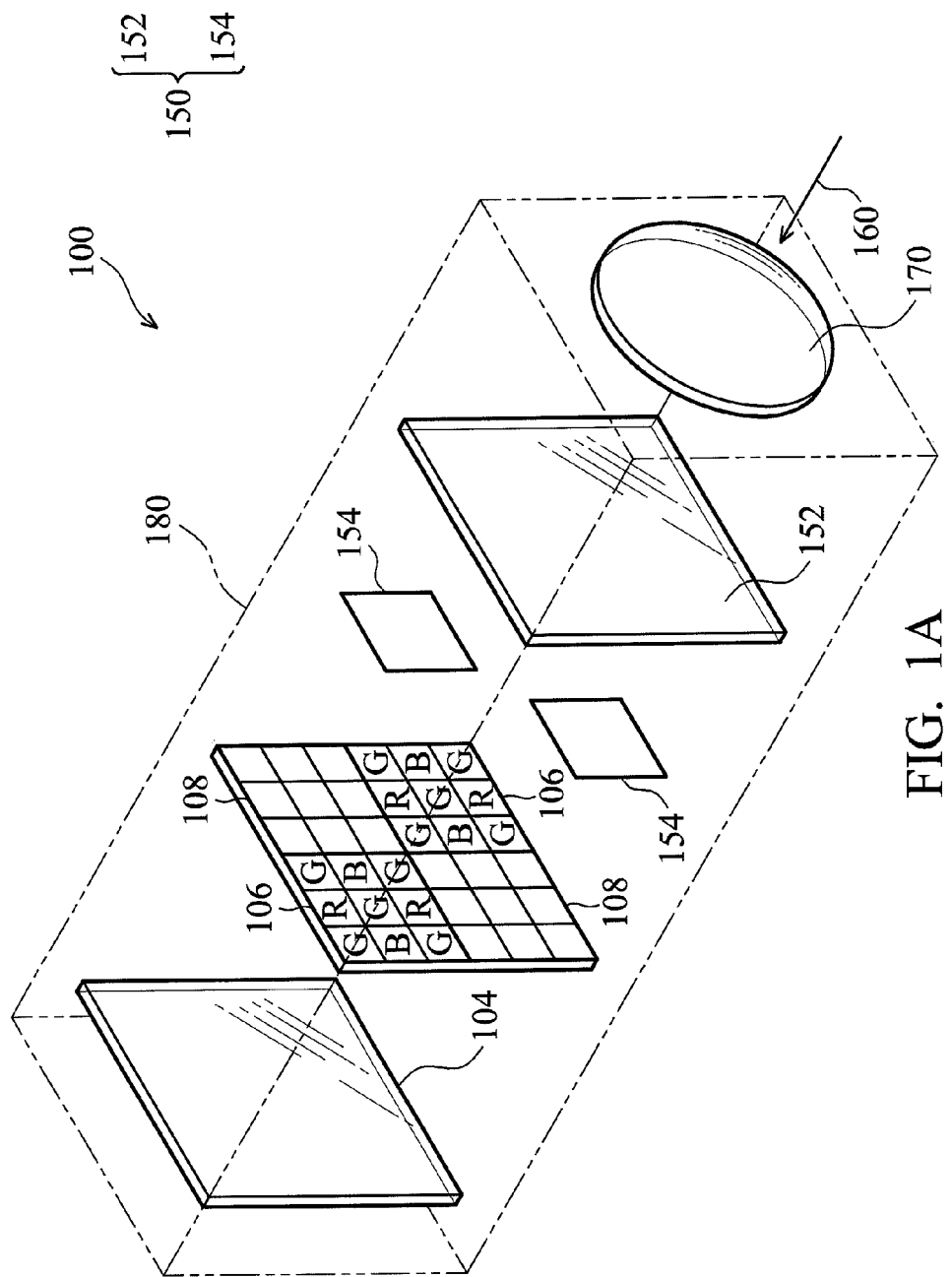
FIG. 1A shows a perspective view of an image-sensing apparatus according to an embodiment of the present disclosure.

The following description is of the best-contemplated mode of carrying out the invention. This description is made for the purpose of illustrating the general principles of the invention and should not be taken in a limiting sense. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. The scope of the invention is best determined by reference to the appended claims.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments. In addition, the term "in front of" in this specification means an object at a position ahead of another object in a traveling direction of the incident light. The term "infrared spectrum" means that a range continued from the red end of the visible spectrum and comprises a wavelength range from 650 nm to 1 mm.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Embodiments according to the present disclosure discloses embodiments of an image-sensing apparatus which comprises an optical filter including a two-band passing filter and an infrared passing filter overlapping the two-band passing filter. The optical filter permits only the incident light in the infrared region to pass to the ToF pixel array. In addition, the optical filter may optionally comprise a visible light passing filter adjacent to the infrared passing filter and overlapping the two-band passing filter.

FIG. 1A shows a perspective view of an image-sensing apparatus according to an embodiment of the present disclosure. In an embodiment, the image-sensing apparatus 100 may comprise a module lens 170 and an image sensor integrated within a housing 180. In this embodiment, the image sensor may be a CMOS image sensor or a CCD image sensor, for example, an image sensor comprising a back-illuminated RGB pixel array and a back-illuminated ToF pixel array. The image sensor may comprise a substrate 104, an RGB pixel array 106 and a ToF pixel array 108 formed on the substrate 104, and an optical filter 150 covering the RGB and ToF pixel array 106, 108. The module lens 170 may be disposed on the housing. The module lens 170 may be configured to gather the incident light from the environment outside the housing 180 and image them onto the image sensor. For example, the module lens 170 may image the environment on both the RGB pixel array 106 and the ToF pixel array 108. In an embodiment, the module lens 170 may have a size of about 3 mm to about 10 mm. The optical filter 150 may be configured to a band-pass filter which permits only the incident light 160 in the desired wavelength regions to arrive at the RGB pixel array 106 and the ToF pixel array 108.

Figure 1B:
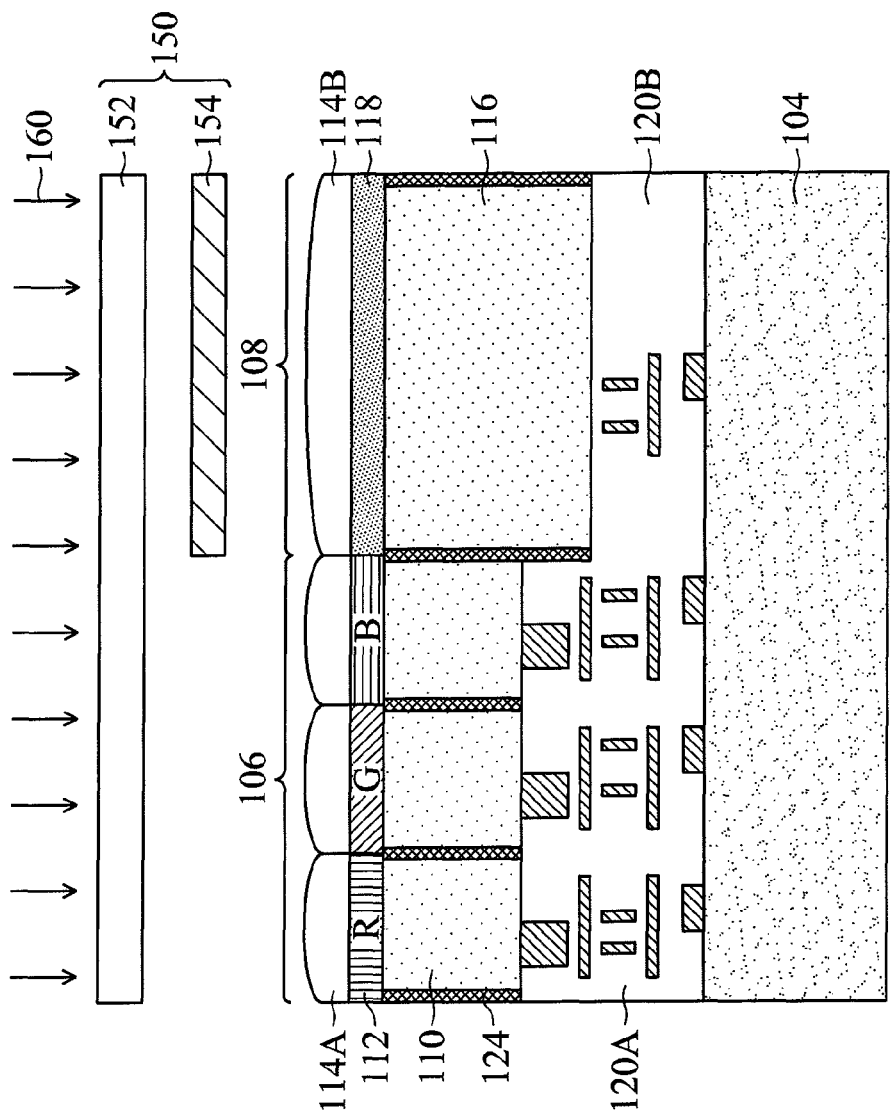
FIG. 1B shows a cross-sectional view of the image sensor of FIG. 1A according to an embodiment of the present disclosure.

Referring to FIG. 1B, illustrated is a cross-sectional view of the image sensor of FIG. 1A according to an embodiment of the present disclosure. In an embodiment, the substrate 104 may be a device substrate fabricated using a semiconductor fabrication process, such as a device wafer. The RGB pixel array 106 may comprise a first photodiode array 110, an RGB color filter array 112 over the first photodiode array 110, and a first interconnection structure 120A between the first photodiode array 110 and the substrate 104. The ToF pixel array 108 may comprise a second photodiode array 116 and a second interconnection structure 120B between the second photodiode array 116 and the substrate 104. In an embodiment, the first interconnection structure 120A may connect to the second interconnection structure 120B. In addition, the ToF pixel array 108 may optionally comprise a transparent filling layer 118 having a thickness substantially equal to that of the RGB color filter array 112 on the second photodiode array 116 to provide a substantially flat surface with the RGB color filter array 112. For example, a microlens structure 114A of the RGB pixel array 106 and a microlens structure 114B of the ToF pixel array 108 may be disposed on the substantially flat surface. The RGB pixel array 106 and the ToF pixel array 108 may comprise a plurality of unit pixels. One or more photodiodes of the first photodiode array 110 and the second photodiode array 116 may be located in each unit pixel. In an embodiment, a spacer 124 may be disposed around each unit pixel of the RGB and ToF pixel array 106, 108 for isolation.

The first photodiode array 110 and the second photodiode array 116 may absorb the incident light 160 in the visible light region and in the infrared-light region, respectively, and then convert the light signals to electrical signals. The electrical signals may be transmitted to the substrate 104 to perform further processing via the first and second interconnection structures 120A, 120B. In this embodiment, the first photodiode array 110 may have a thickness thinner than that of the second photodiode array 116. For example, the first photodiode array 110 may have a thickness of about 2.1 um to about 3.5 um. The second photodiode array 116 may have a thickness of about 2.1 um to about 10 um. In addition, the first and second interconnection structures 120A, 120B may correspondingly have different thicknesses. For example, the first interconnection structure 120A may have a thickness greater than that of the second interconnection structure 120B. In an embodiment, the different thicknesses of the first and second interconnection structures 120A, 120B may be due to different numbers of inter-layer dielectrics and metallization layers.

The optical filter 150 may comprise a two-band passing filter 152 for passing visible light and infrared light, and an infrared passing filter 154 overlapping to the two-band passing filter 152. In an embodiment, the two-band passing filter 152 may permit the incident light 160 in two wavelength regions to pass, such as in a visible light region of between 400 and 650 nm and an infrared region of around 850 nm. The infrared passing filter 154 may filter out visible light and portions of infrared light such as in a wavelength region of 850 nm to 1 mm. That is, the infrared passing filter 154 may permit the incident light 160 only in a wavelength region of between 650 nm and 850 nm to pass. The two-band passing filter 152 may cover the whole of the RGB pixel array 106 and the ToF pixel array 108. The infrared passing filter 154 may be placed in front of the ToF pixel array 108 (in the direction of incident light) and overlap the two-band passing filter 152 such that a combination of the two-band passing filter 152 and the infrared passing filter 154 may permit only the incident light 160 in the infrared region (i.e., around 850 nm) to pass to the ToF pixel array 108. In other words, the RGB pixel array 106 may be placed below the two-band passing filter 152, and the ToF pixel array 108 adjacent to the RGB pixel array 106 may be placed below the two-band passing filter 152 and the infrared passing filter 154. In addition, in an embodiment, the infrared passing filter 154 may be placed over the microlens 114B. In other embodiments, the infrared passing filter 154 may be placed below the microlens 114B (not shown). In some embodiments, as the infrared passing filter 154 may be in contact with, such as coated on, the two-band passing filter 152. In other embodiments, the infrared passing filter 154 and the two-band passing filter 152 may have other features interposed therebetween, such as other filters or lens structures (not shown) as long as the incident light 160 may pass both of the infrared passing filter 154 and the two-band passing filter 152 before entering the TOF pixel array 108. In other words, in this embodiment, the incident light 160 in the two wavelength regions may pass to the RGB pixel array 106 and only the incident light 160 in the infrared region may pass to the ToF pixel array 108. In some embodiments, the two-band passing filter 152 and the infrared passing filter 154 may be a photoresist, a color filter or commercially available optical filters. The two-band passing filter 152 and the infrared passing filter 154 may be formed by CVD, PECVD, other thin film fabricating methods or combinations thereof. The two-band passing filter 152 and the infrared passing filter 154 may be in direct contact with each other or separately disposed.

In this embodiment, the optical filter 150 needs no infrared cut filter disposed in front of the RGB pixel array 106. As noted above, the first photodiode array 110 may have a thickness thinner than that of the second photodiode array 116. Thus, although the incident light 160 in the two wavelength regions may pass to the first photodiode array 110, the incident light 106 in the infrared region would not be substantially absorbed by the first photodiode array 110.

Figure 2A:
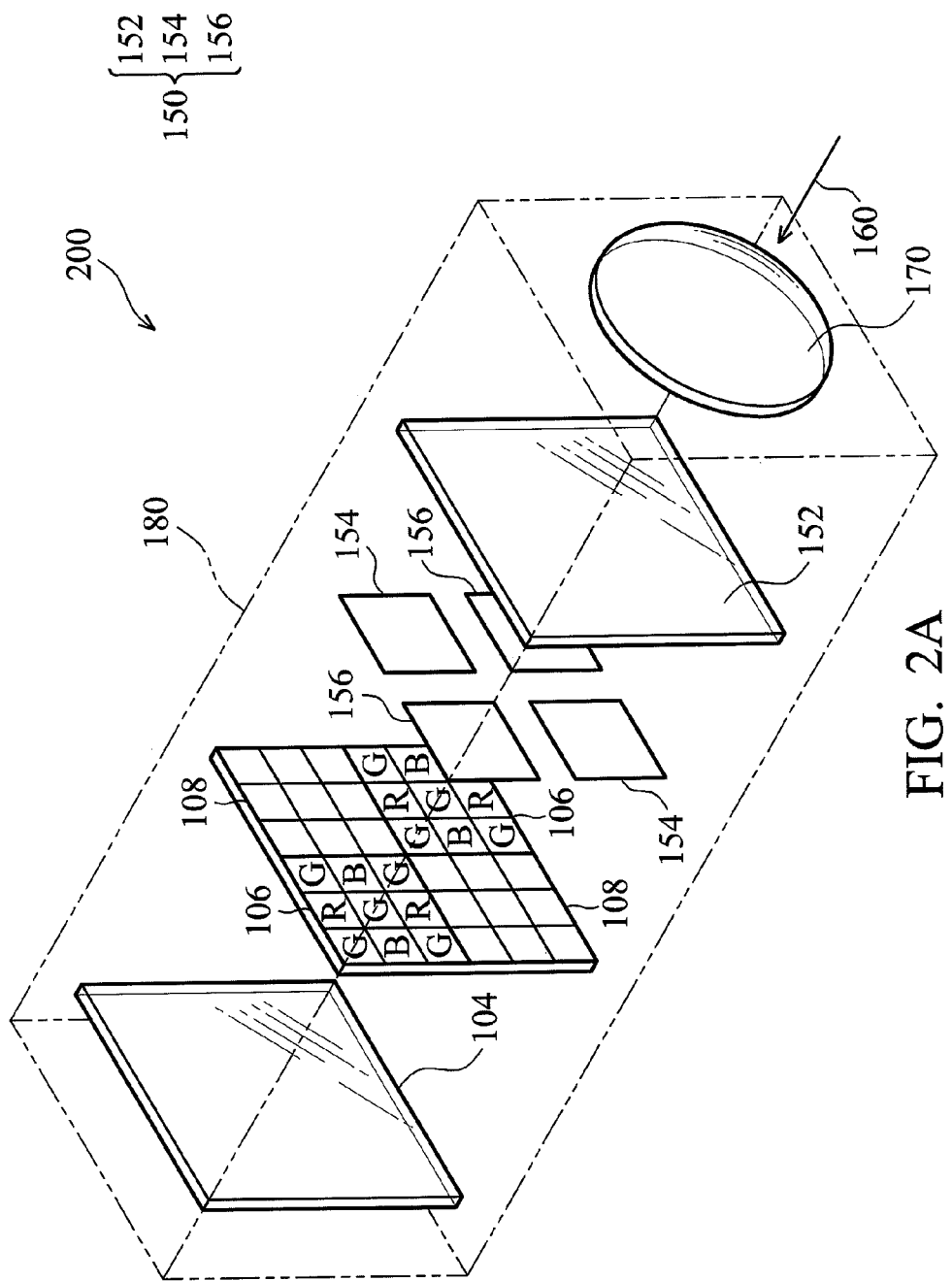
FIG. 2A shows a perspective view of an image-sensing apparatus according to another embodiment of the present disclosure.

FIG. 2A shows a perspective view of an image-sensing apparatus according to an embodiment of the present disclosure. In this embodiment, like reference numerals are used to indicate elements substantially similar to the elements described in the above embodiments, and thus a detailed description of the substantially similar elements will not be repeated.

Referring to FIG. 2A, the image-sensing apparatus 200 may comprise a module lens 170 and an image sensor integrated within a housing 180. In this embodiment, the image sensor may be a CMOS image sensor or a CCD image sensor, such as an image sensor comprising a front-illuminated RGB pixel array and a front-illuminated ToF pixel array. The image sensor may comprise a substrate 104, an RGB pixel array 106 and a ToF pixel array 108 formed on the substrate 104 and an optical color filter 150 covering the RGB and ToF pixel arrays 106, 108. The module lens 170 may be disposed on the housing 180. The module lens 170 may be configured to gather the incident light 160 from the environment outside the housing 180 and image it on both the RGB and ToF pixel arrays 106, 108. The optical filter 150 may be configured to filter the incident light 160 to permit only the incident light 160 in the desired wavelength regions to arrive at the RGB and ToF pixel arrays 106, 108.

Figure 2B:
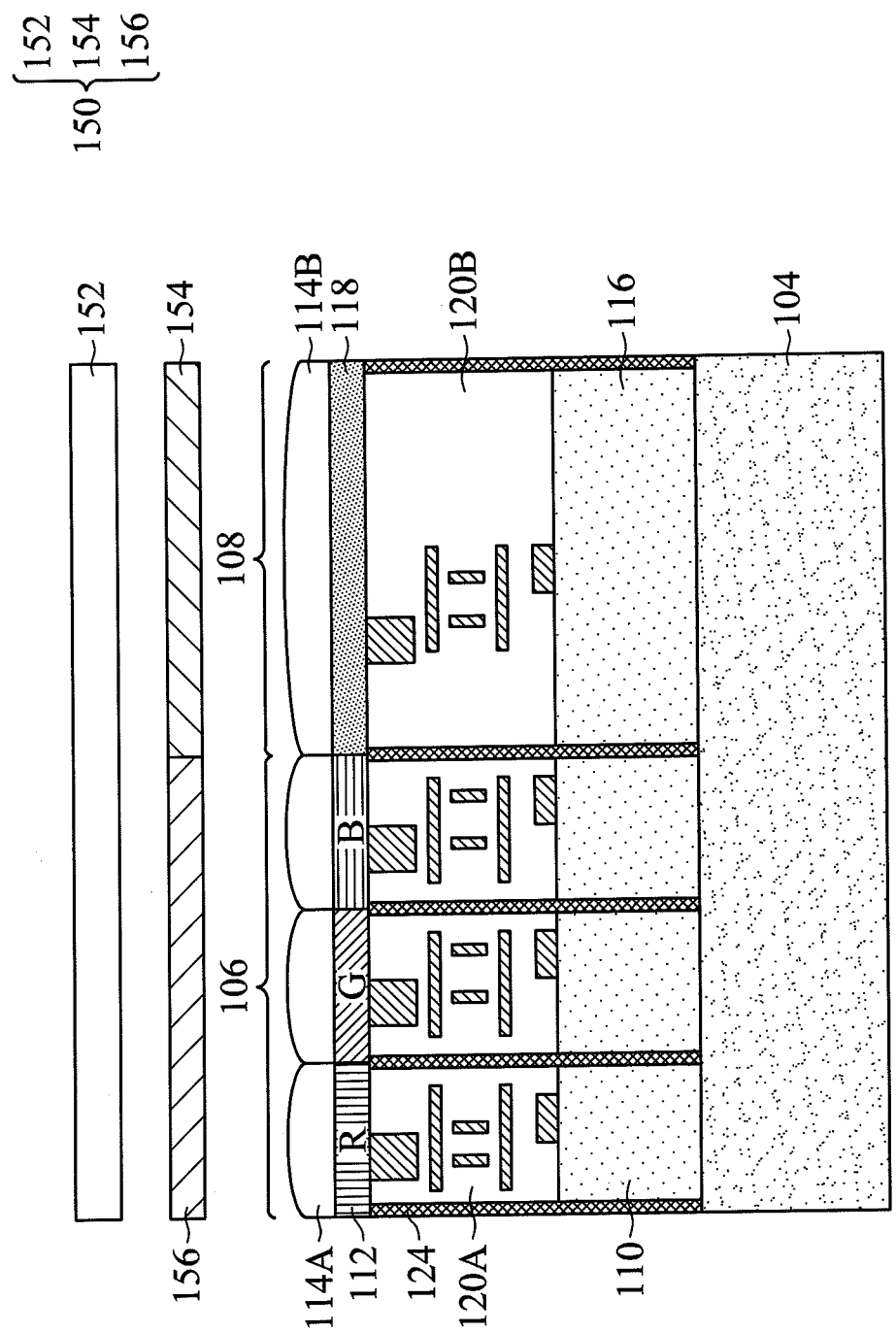
FIG. 2B shows a cross-sectional view of the image sensor of FIG. 2A according to an embodiment of the present disclosure.

Referring to FIG. 2B, illustrated is a cross-sectional view of the image sensor of FIG. 2A according to an embodiment of the present disclosure. In an embodiment, the substrate may be a device substrate fabricated using a semiconductor fabrication process, such as a device wafer. The RGB pixel array 106 may comprise a first photodiode array 110, an RGB color filter array 112 over the first photodiode array 110, and a first interconnection structure 120A between the first photodiode array 110 and the RGB color filter array 112. The ToF pixel array 108 may comprise a second photodiode array 116, and a second interconnection structure 120B over the second photodiode array 116. In an embodiment, the first interconnection structure 120A may connect to the second interconnection structure 120B. In addition, the ToF pixel array 108 may optionally comprise a transparent filling layer 118 over the second interconnection structure 120B to provide a substantially flat surface where a microlens structure of the RGB and ToF pixel array 106, 108 may be disposed thereon. In this embodiment, the first photodiode array 110 may have a thickness substantially equal to that of the second photodiode array 116. For example, the first photodiode array and the second photodiode array may have a thickness of about 2.1 um~about 10 um.

The optical filter 150 may comprise a two-band passing filter 152 for passing visible light and infrared light, a visible light passing filter 156 overlapping the two-band passing filter 152, and an infrared passing filter 154 adjacent to the visible light passing filter 156 and two-band passing filter 152. The two-band passing filter 152 may permit the incident light 160 in two wavelength regions to pass, such as in a visible region of between 400 and 650 nm and an infrared region of around 850 nm. The infrared passing filter 154 may permit the incident light 160 in a wavelength region of between 650 nm and 850 nm to pass. The two-band passing filter 152 may cover the whole of the RGB and ToF pixel array 106, 108. The infrared passing filter 154 may be placed in front of the ToF pixel array 108 and overlap the two-band passing filter 152 such that a combination of the two-band passing filter 152 and the infrared passing filter 154 may permit only the incident light 160 in the infrared region (i.e., around 850 nm) to pass to the ToF pixel array 108. In some embodiments, the infrared passing filter 154 and the two-band passing filter 152 may be contacted to each other or have other features therebetween as long as the incident light 160 may pass both of the infrared passing filter 154 and the two-band passing filter 152 before entering the TOF pixel array 108. In addition, the visible light passing filter 156 may be placed in front of the RGB pixel array 106 and overlap the two-band passing filter 152 such that a combination of the two-band passing filter 152 and the visible light passing filter 156 may permit only the incident light 160 in the visible light region to pass to the RGB pixel array 106. Similar with the infrared passing filter 154 and the two-band passing filter 152, visible light passing filter 156 and the two-band passing filter 152 may be contacted to each other (e.g. coated on) or have other features therebetween as long as the incident light 160 may pass both of the infrared passing filter 154 and the two-band passing filter 152 before entering the RGB pixel array 106. the In other words, the RGB pixel array 106 may be placed below the two-band passing filter 152 and the visible light passing filter 156, and the ToF pixel array 108 adjacent to the RGB pixel array 106 may be placed below the two-band passing filter 152 and the infrared passing filter 154. In addition, in an embodiment, the infrared passing filter 154 may be placed over the microlens 114B. In other embodiments, the infrared passing filter 154 may be placed below the microlens 114B (not shown). In this embodiment, the first and second interconnection structures 120A, 120B are placed in front of the first photodiode array 110 and the second photodiode array 116, and the absorptions of the first photodiode array 110 and the second photodiode array 116 in each wavelength region are similar. Thus, the visible light passing filter 156 is preferably needed for the RGB pixel array 106. In this embodiment, only the incident light 160 in the visible light region may pass to the RGB pixel array 106 and only the incident light 160 in the infrared region may pass to the ToF pixel array 108.

Figure 3A:
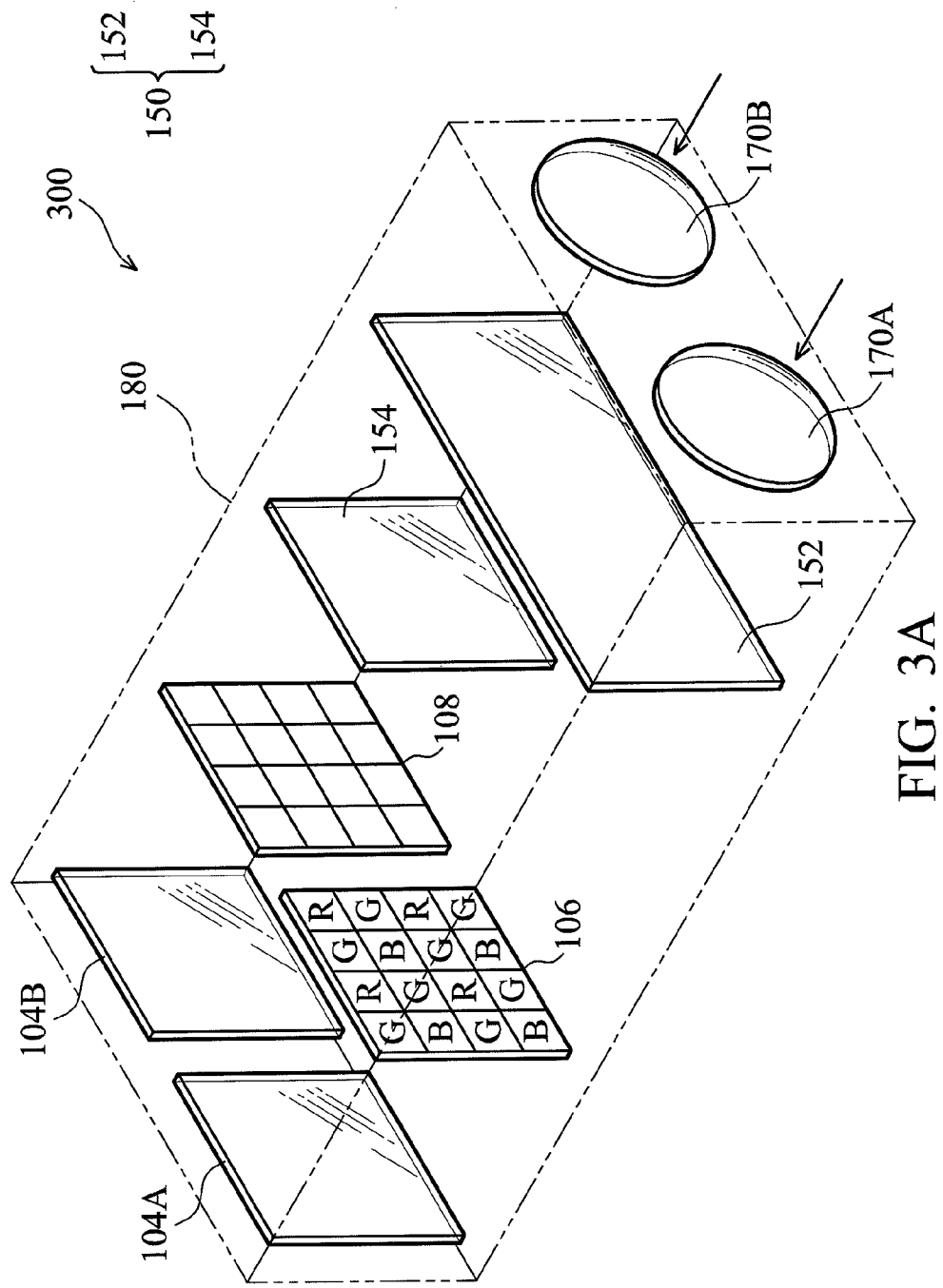
FIG. 3A shows a perspective view of an image-sensing apparatus according to another embodiment of the present disclosure.

FIG. 3A shows a perspective view of an image-sensing apparatus according to another embodiment of the present disclosure. In this embodiment, like reference numerals are used to indicate elements substantially similar to the elements described in the above embodiments, and thus a detailed description of the substantially similar elements will not be repeated.

In this embodiment, the image sensor may be a CMOS image sensor, such as an image sensor comprising a back-illuminated RGB pixel array and a back-illuminated ToF pixel array or a hybrid image sensor comprising a back-illuminated RGB pixel array and a front-illuminated ToF pixel array. Referring to FIG. 3A, the image-sensing apparatus 300 may comprise a first module lens 170A, a second module lens 170B, and an image sensor packaged within a housing 180. The image sensor may comprise a first substrate 104A, a second substrate 10413, an RGB pixel array 106 formed on the first substrate 104A, a ToF pixel array 108 formed on the second substrate 104B, and an optical filter 150 covering the RGB pixel array 106 and the ToF pixel array 106. The first substrate 104A and the second substrate 104B are individual from each other, and can be fabricated from the same or different wafers. In other words, the RGB pixel array 106 and the ToF pixel array 108 may be fabricated individually. The optical filter 150 may be configured to filter the incident light 160 to permit only the incident light in the desired wavelength regions to arrive at the RGB pixel array 106 and the ToF pixel array 108. The first module lens 170A and second module lens 170B may be disposed on the housing 180. The first module lens 170A and the second module lens 170B may be configured to gather the incident light 160 and image it onto the RGB pixel array 106 and the ToF pixel array 108, respectively.

Figure 3B:
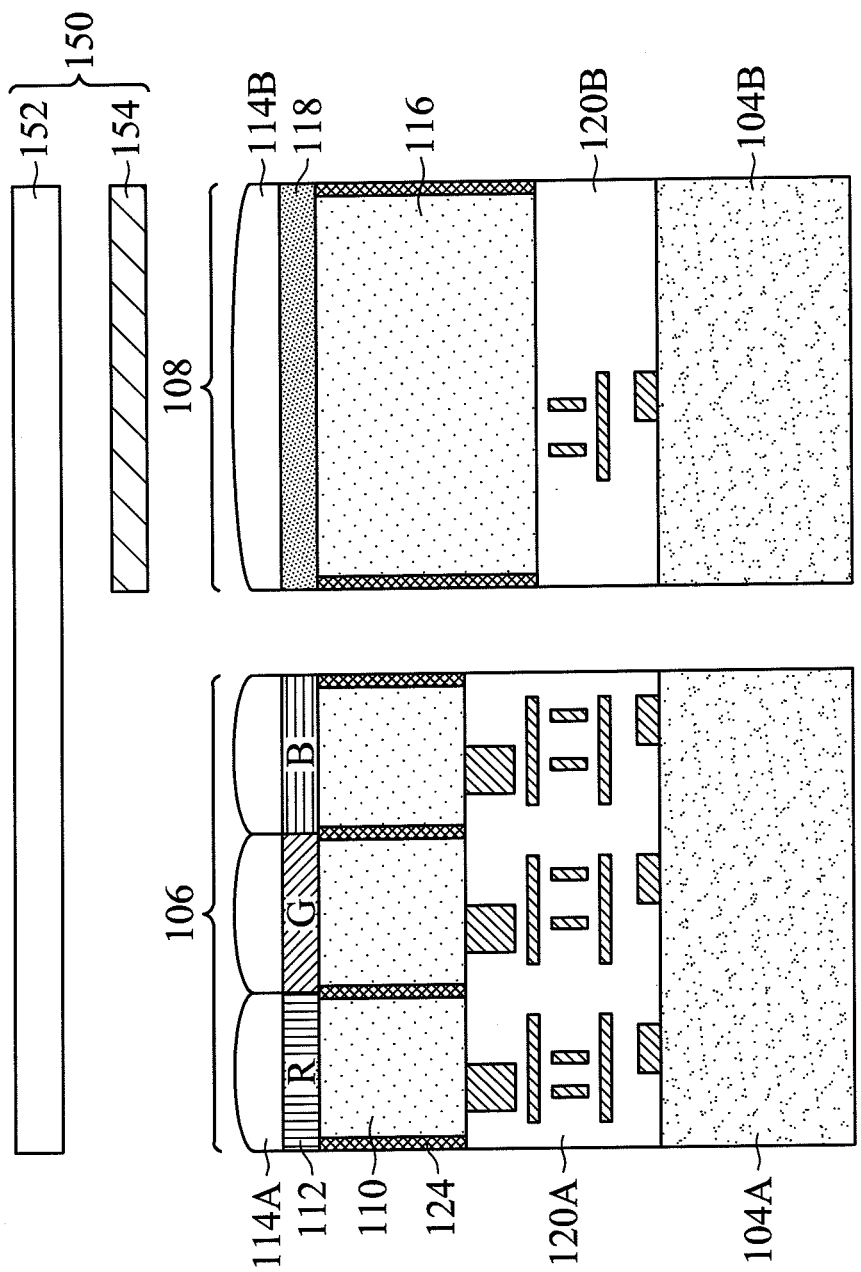
FIGS. 3B and 3C show cross-sectional views of the image sensor of FIG. 3A according to embodiments of the present disclosure.

Referring to FIG. 3B, illustrated is a cross-sectional view of the image sensor of FIG. 3A according to an embodiment of the present disclosure. In this embodiment, the image sensor comprising the back-illuminated RGB pixel array and the back-illuminated ToF pixel array is illustrated. Similar to the CMOS image sensor of FIG. 1B, the RGB pixel array 106 may comprise a first photodiode array 110, an RGB color filter array 112, and a first interconnection structure 120A. The ToF pixel array 108 may comprise a second photodiode array 116 and a second interconnection structure 120B. In this embodiment, the first photodiode array 110 may have a thickness substantially thinner than that of the second photodiode array 116, and therefore the optical filter 150 needs no infrared cut filter placed in front of the RGB pixel array 106. The optical filter 150 may only comprise a two-band passing filter 152 for passing visible light and infrared light, and an infrared passing filter 154 overlapping the two-band passing filter 152 (including over or below the microlens 114B). In other words, the RGB pixel array 106 may be placed below the two-band passing filter 152, and the ToF pixel array 108 adjacent to the RGB pixel array 106 may be placed below the two-band passing filter 152 and the infrared passing filter 154.

Figure 3C:
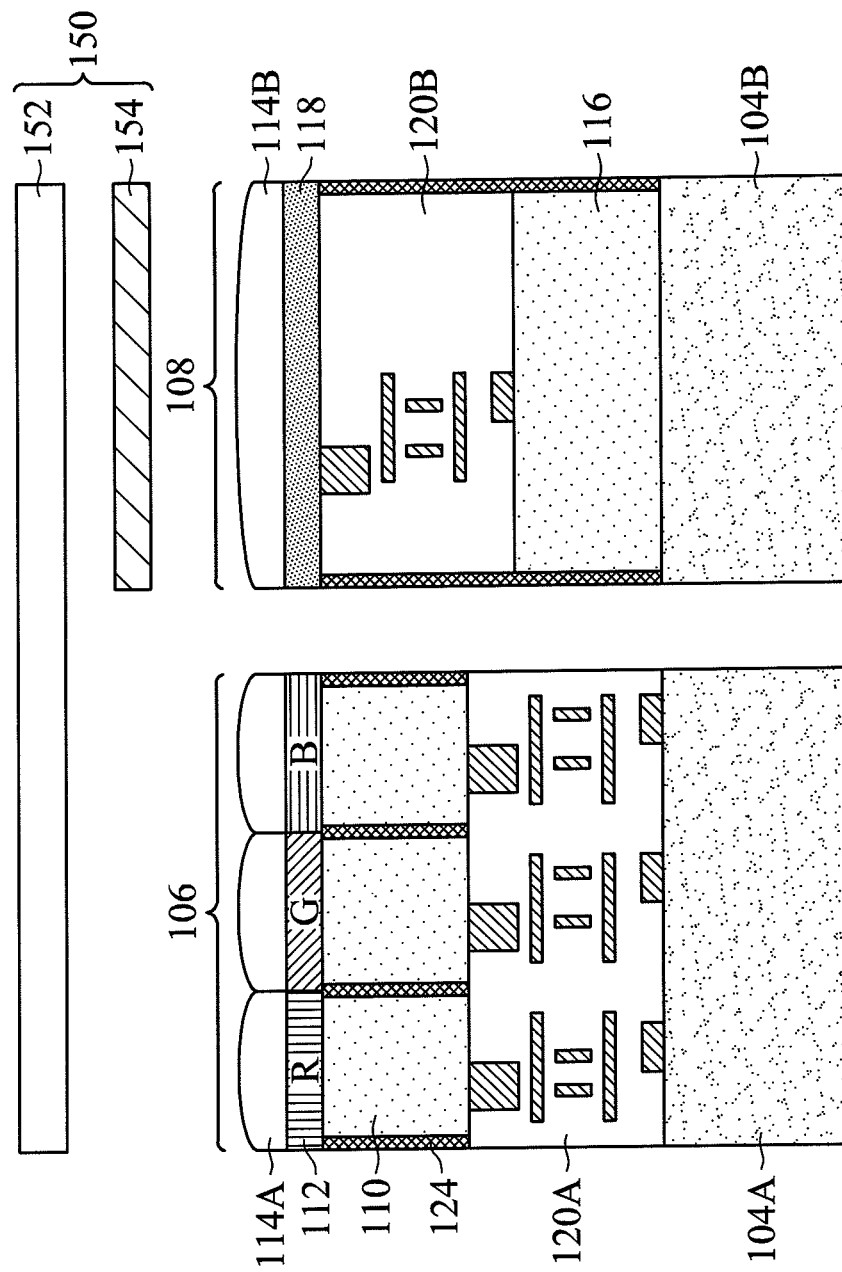

Referring to FIG. 3C, illustrated is a cross-sectional view of the image sensor of FIG. 3A according to another embodiment of the present disclosure. In this embodiment, a hybrid image sensor comprising a back-illuminated RGB pixel array and a front-illuminated ToF pixel array is illustrated. The back-illuminated RGB pixel array 106 may comprise a first substrate 104A, a first photodiode array 110 over the first substrate 104A, and a first interconnection structure 120A between the first photodiode array 110 and the first substrate 104A. The front-illuminated ToF pixel array 108 may comprise a second substrate 104B, a second photodiode array 110 over the second substrate 104B, and a second interconnection structure 120B between the second substrate 104 and the second photodiode array 116. In this embodiment, the first photodiode array 110 may have a thickness thinner than or substantially equal to that of the second photodiode array 118, and the optical filter needs no infrared cut filter placed in front of the RGB pixel array. The optical filter 150 may only comprise a two-band passing filter 152 for passing visible light and infrared light, and an infrared passing filter 154 overlapping the two-band passing filter 152 (including over or below the microlens 114B). In other words, the RGB pixel array 106 may be placed below the two-band passing filter 152, and the ToF pixel array 108 adjacent to the RGB pixel array 106 may be placed below the two-band passing filter 152 and the infrared passing filter 154. More design variations may be achieved by using the hybrid image sensor.

Figure 4A:
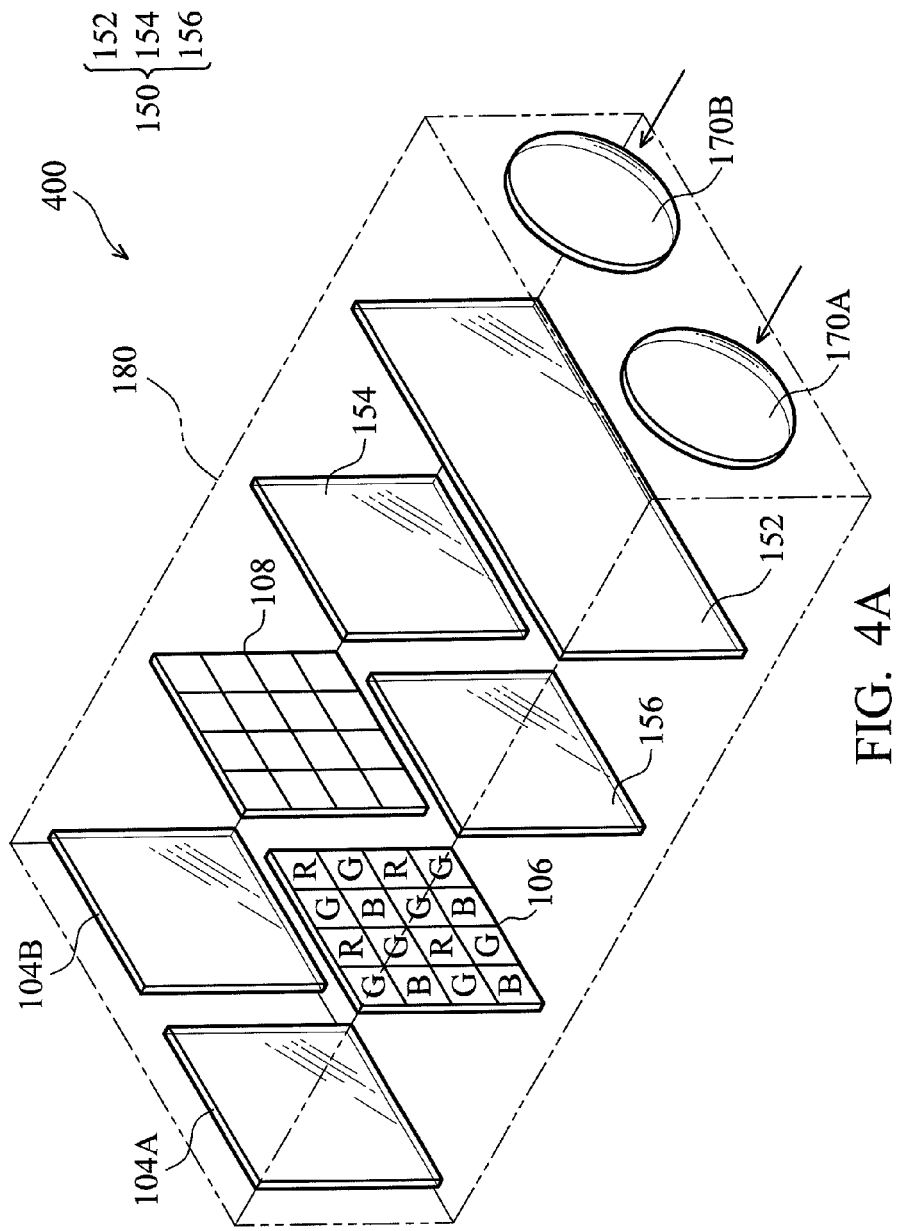
FIG. 4A shows a perspective view of an image-sensing apparatus according to a further embodiment of the present disclosure.

FIG. 4A shows a perspective view of an image-sensing apparatus according to a further embodiment of the present disclosure. In this embodiment, like reference numerals are used to indicate elements substantially similar to the elements described in the above embodiments, and thus, a detailed description of the substantially similar elements will not be repeated.

In this embodiment, the image sensor may be an image sensor comprising a front-illuminated RGB pixel array and a front-illuminated ToF pixel array or a hybrid image sensor comprising a front-illuminated RGB pixel array and a back-illuminated ToF pixel array. Referring to FIG. 4A, the image-sensing apparatus 400 may comprise a first module lens 170A, a second module lens 170B, and an image sensor packaged within a housing 180. The image sensor may comprise a first substrate 104A and second substrate 104B, an RGB pixel array 106 formed on the first substrate 104A, a ToF pixel array 108 formed on the second substrate 104B, and an optical filter 150 covering the RGB and ToF pixel arrays 106, 108. The first substrate 104A and the second substrate 104B are individual from each other, and can be fabricated from the same or different wafers. In other words, the RGB pixel array 106 and the ToF pixel array 108 may be fabricated individually. The optical filter 150 may be configured to filter the incident light 160 to permit only the incident light 160 in the desired wavelength regions to arrive at the RGB pixel array 106 and the ToF pixel array 108. The first module lens 170A and second module lens 107B may be disposed on the housing. The first module lens 170A and second module lens 107B may be configured to gather the incident light 160 and image it onto the RGB pixel array 106 and the ToF pixel array 108, respectively.

Figure 4B:
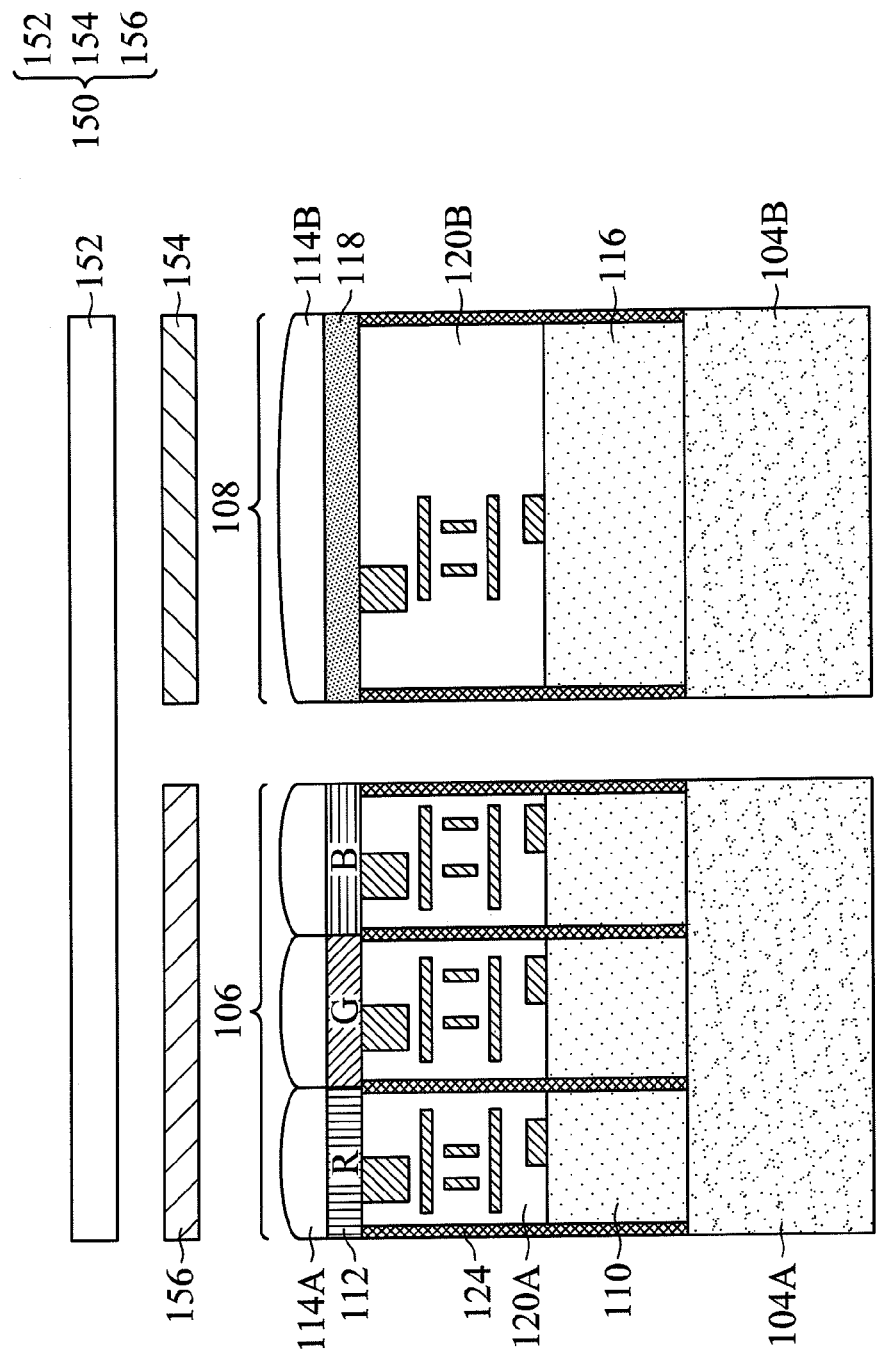
FIGS. 4B and 4C show cross-sectional views of the image sensor of FIG. 4A according to embodiments of the present disclosure.

Referring to FIG. 4B, illustrated is a cross-sectional view of the image sensor of FIG. 4A according to an embodiment of the present disclosure. In this embodiment, a front-illuminated image sensor is illustrated. Similar to the image sensor of FIG. 2B, the RGB pixel array 106 may comprise a first photodiode array 110, an RGB color filter array 112 over the first photodiode array 110, and a first interconnection structure 120B between the RGB color filter array 112 and the first photodiode array 110. The ToF pixel array 108 may comprise a second photodiode array 116 and a second interconnection structure 120A over the second photodiode array 116. In this embodiment, the first photodiode array 110 may have a thickness substantially equal to that of the second photodiode array 116, and a visible light passing filter 156 is preferably needed to be placed on the RGB pixel array 106. In other words, the optical filter 150 may comprise a two-band passing filter 152 for passing visible light and infrared light, a visible light passing filter 156 overlapping the two-band passing filter 152 (including over or below the microlens 114A), and an infrared passing filter 154 adjacent to the visible light passing filter 156 and overlapping the two-band passing filter 152 (including over or below the microlens 114B). In other words, the RGB pixel array 106 may be placed below the two-band passing filter 152 and the visible light filter 156, and the ToF pixel array 108 adjacent to the RGB pixel array 106 may be placed below the two-band passing filter 152 and the infrared passing filter 154.

Figure 4C:
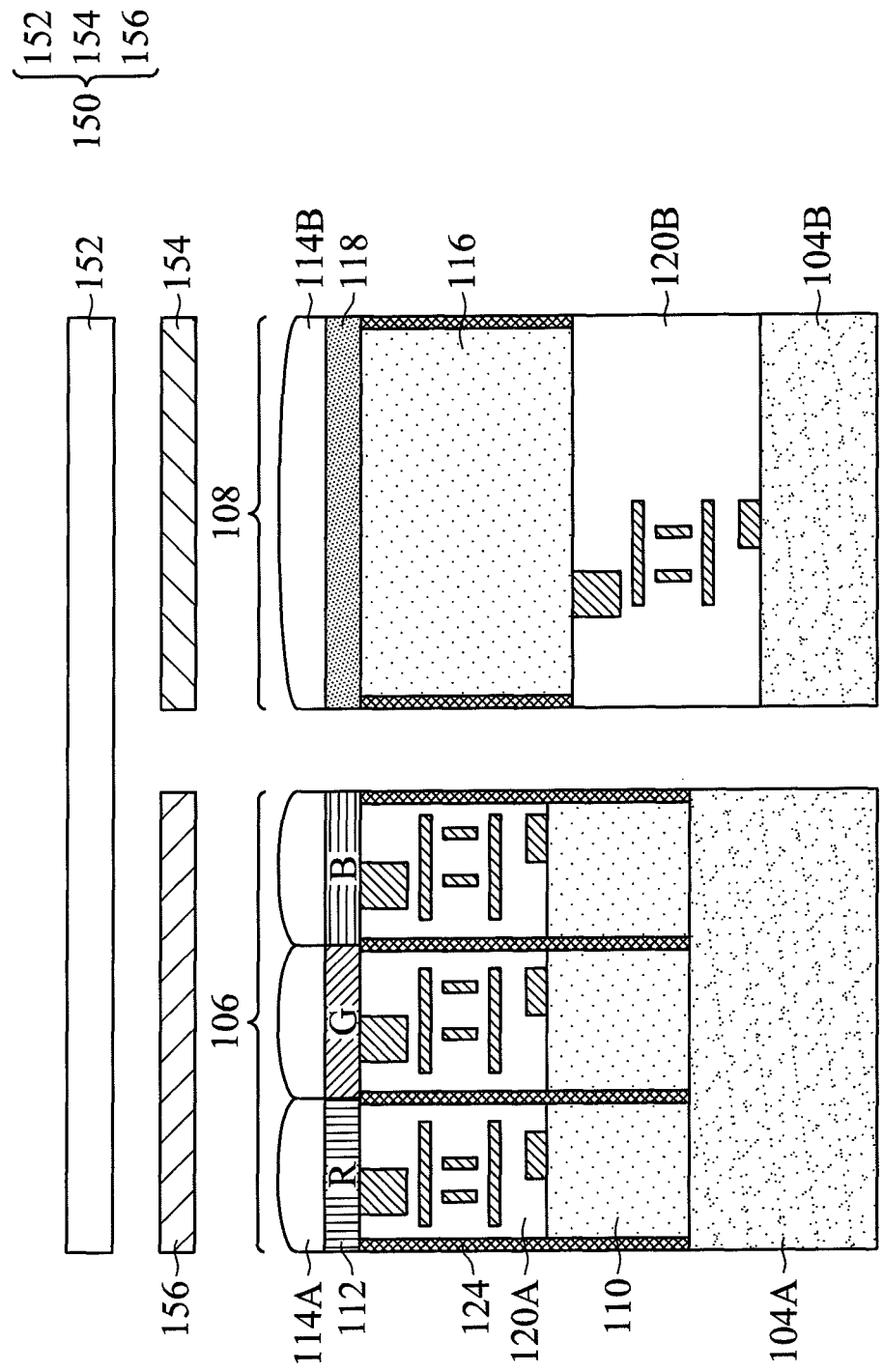

Referring to FIG. 4C, illustrated is a cross-sectional view of the image sensor of FIG. 4A according to another embodiment of the present disclosure. In this embodiment, a hybrid CMOS image sensor is illustrated. The hybrid CMOS image sensor may comprise a front-illuminated RGB pixel array and a back-illuminated ToF pixel array. The front-illuminated RGB pixel array 106 may comprise a first substrate 104A, a first photodiode array 110 over the first substrate 104A, an RGB color filter array 112 over the first photodiode array 110, and a first interconnection structure 120A between the RGB color filter array 112 and the first photodiode array 110. The front-illuminated ToF pixel array 108 may comprise a second substrate 104B, a second photodiode array 116 over the second substrate 104B, and a second interconnection structure 120B below the second photodiode array 116. The optical filter 150 may comprise a two-band passing filter 152 for passing visible light and infrared light, a visible light passing filter 156 overlapping the two-band passing filter 152 (including over or below the microlens 114A), and an infrared passing filter 154 adjacent to the visible light passing filter 156 and overlapping the two-band passing filter 152 (including over or below the microlens 114B). In other words, the RGB pixel array 106 may be placed below the two-band passing filter 152 and the visible light filter 156, and the ToF pixel array 108 adjacent to the RGB pixel array 106 may be placed below the two-band passing filter 152 and the infrared passing filter 154. In this embodiment, the first photodiode array 110 and the second photodiode array 116 may each have any suitable thickness since the visible light passing filter 156 is placed in front of the RGB pixel array 106.

The present disclosure discloses embodiments of an image-sensing apparatus which comprises an optical filter which permits only the incident light in the desired wavelength regions to pass to the RGB pixel array and ToF pixel array. Reduced interference and noise may be obtained. Moreover, by using the optical filter illustrated above, the RGB pixel array and the ToF pixel array may be fabricated together by using wafer-level packaging techniques or fabricated individually. The RGB pixel array and the ToF pixel array may be either of a back-illuminated type or a front-illuminated type, and more design variations may be achieved by using the hybrid image sensor. Accordingly, a two-band pass filter array may be obtained which can be fabricated in mass production and which permits only the light in the visible light range to pass to each unit pixel of the RGB image sensor, and only the light in the infrared range to pass to each unit pixel of the ToF camera.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensing apparatus, comprising:
    an optical filter array including a two-band passing filter and an infrared filter;
    an RGB pixel array placed below the two-band passing filter; and
    a ToF pixel array adjacent to the RGB pixel array and placed below the two-band passing filter and the infrared filter, wherein a combination of the two-band passing filter and the infrared passing filter permits only the incident light in the infrared region to pass to the ToF pixel array, and wherein a transparent filling layer is placed between the ToF pixel array and the infrared filter.

2. The image-sensing apparatus as claimed in claim 1, wherein the RGB pixel array and the ToF pixel array are disposed on a substrate.

3. The image-sensing apparatus as claimed in claim 2, wherein the RGB pixel array comprises a first photodiode array and an RGB color filter array over the photodiode array, and the ToF array comprises a second photodiode array, wherein the first photodiode array has a thickness thinner than that of the second photodiode array.

4. The image-sensing apparatus as claimed in claim 3, wherein the RGB pixel array further comprises a first interconnection structure between the first photodiode array and the substrate, and the ToF pixel array further comprises a second interconnection structure between the second interconnection structure and the substrate.

5. The image-sensing apparatus as claimed in claim 3, wherein the transparent filling layer is located on the second photodiode array.

6. The image-sensing apparatus as claimed in claim 2, wherein the RGB pixel array comprises a first photodiode array and an RGB color filter array over the first photodiode array, and the ToF array comprises a second photodiode array, wherein the first photodiode array has a thickness substantially equal to that of the second photodiode array.

7. The image-sensing apparatus as claimed in claim 2, wherein the substrate, the optical filter array, the RGB pixel array and the TOF pixel array are packaged within a housing.

8. The image-sensing apparatus as claimed in claim 7, further comprising a module lens on the housing, wherein the module lens is configured to gather incident light from the environment and image the incident light on both the RGB pixel array and ToF pixel array.

9. The image-sensing apparatus as claimed in claim 1, wherein the RGB pixel array is disposed on a first substrate, and the ToF pixel array is disposed on a second substrate.

10. The image-sensing apparatus as claimed in claim 9, wherein the RGB pixel array comprises a first photodiode array and an RGB color filter array over the first photodiode array, and the ToF array comprises a second photodiode array.

11. The image-sensing apparatus as claimed in claim 10, wherein the RGB pixel array further comprises a first interconnection structure between the first photodiode array and the first substrate, and the ToF pixel array further comprises a second interconnection structure between the second photodiode array and the second substrate.

12. The image-sensing apparatus as claimed in claim 11, wherein the second photodiode array has a thickness greater than that of the first photodiode array.

13. The image-sensing apparatus as claimed in claim 10, wherein the RGB pixel array further comprises a first interconnection structure between the RGB color filter array and the first photodiode array, and the ToF pixel array further comprises a second interconnection structure on the second photodiode array.

14. The image-sensing apparatus as claimed in claim 10, wherein the RGB pixel array further comprises a first interconnection structure between the RGB color filter array and the first photodiode array, and the ToF pixel array further comprises a second interconnection structure between the second photodiode array and the second substrate.

15. The image-sensing apparatus as claimed in claim 9, wherein the first substrate, the second substrate, the optical filter array, the RGB pixel array and the TOF pixel array are packaged within a housing.

16. The image-sensing apparatus as claimed in claim 15, further comprising a first module lens and a second module lens on the housing and configured to gather incident light from the environment, wherein the first module lens and the second module lens image onto the RGB pixel array and the ToF pixel array, respectively.

17. The image-sensing apparatus as claimed in claim 1, wherein the infrared passing filter permit the incident light in a wavelength region of between about 650 nm and about 850 nm to pass.

18. An image-sensing apparatus, comprising:
a substrate;
an RGB pixel array and a ToF pixel array on the substrate;
a two-band passing filter placed in front of both the RGB pixel array and the ToF pixel array for passing visible light and infrared light; and
an infrared passing filter placed in front of the ToF pixel array for passing infrared light, wherein a combination of the two-band passing filter and the infrared passing filter permits only the incident light in the infrared region to pass to the ToF pixel array, and wherein a transparent filling layer is placed between the ToF pixel array and the infrared passing filter.

19. An image-sensing apparatus, comprising:
an RGB pixel array on a first substrate;
a ToF pixel array on a second substrate adjacent to the first substrate;
a two-band passing filter placed in front of both the RGB pixel array and the ToF pixel array for passing visible light and infrared light; and
an infrared passing filter placed in front of the ToF pixel array for passing infrared light, wherein a combination of the two-band passing filter and the infrared passing filter permits only the incident light in the infrared region to pass to the ToF pixel array.

* * * * *